United States Patent [19]
Hisamoto

[11] Patent Number: 5,321,295
[45] Date of Patent: Jun. 14, 1994

[54] INSULATED GATE BIPOLAR TRANSISTOR AND METHOD OF FABRICATING THE SAME

[75] Inventor: Yoshiaki Hisamoto, Itami, Japan

[73] Assignee: Mitsubishi Denki Kabushiki Kaisha, Tokyo, Japan

[21] Appl. No.: 396,680

[22] Filed: Aug. 22, 1989

[30] Foreign Application Priority Data

Apr. 28, 1989 [JP] Japan .................... 1-111106(P)

[51] Int. Cl.$^5$ ............... H01L 27/02; H01L 29/74; H01L 29/10; H01L 29/78
[52] U.S. Cl. .................... 257/401; 257/133; 257/146; 257/336; 257/341; 257/378
[58] Field of Search ............... 257/336, 341, 133, 146, 257/378, 401

[56] References Cited

U.S. PATENT DOCUMENTS

| | | | |
|---|---|---|---|
| 4,482,914 | 11/1984 | Mano et al. | 357/59 |
| 4,561,003 | 12/1985 | Tihanyi et al. | 357/23.4 |
| 4,672,407 | 6/1987 | Nakagawa et al. | 357/23.4 |
| 4,705,759 | 11/1987 | Lidow et al. | 437/29 |
| 4,712,126 | 12/1987 | Slattery | 357/59 |
| 4,717,940 | 1/1988 | Shinohe et al. | 357/43 |
| 4,782,372 | 11/1988 | Nakagawa et al. | 357/23.4 |
| 4,794,432 | 12/1988 | Yilmaz et al. | 357/23.4 |
| 4,809,045 | 2/1989 | Yilmaz | 357/23.4 |
| 4,851,888 | 7/1989 | Ueno | 357/23.4 |

FOREIGN PATENT DOCUMENTS

| | | | |
|---|---|---|---|
| 55-048972 | 4/1980 | Japan | 357/23.4 |
| 61-164263 | 7/1986 | Japan | 357/23.4 |
| 62-076671 | 4/1987 | Japan | 357/23.4 |
| 62-163372 | 7/1987 | Japan | 357/23.4 |

OTHER PUBLICATIONS

H. Yilmaz, "Cell Geometry Effect on IGT Latch-Up", IEEE Electron Device Letters, Aug. 1985, pp. 419–421.
A. Nakagawa et al., "Safe Operating Area for 1200 V Nonlatched Bipolar-Mode MOSFETs", IEEE Transactions on Electron Devices, Feb. 1987, pp. 351–354.

*Primary Examiner*—Ngan Ngo
*Attorney, Agent, or Firm*—Oblon, Spivak, McClelland, Maier & Neustadt

[57] ABSTRACT

An insulated gate bipolar transistor comprises an insulation film (7) formed on a channel region (6) and a gate electrode (8) formed on the insulation film (7). The end portion of the gate electrode (8) has recesses so that the gage electrode (8) covers part of the channel region (6) at a predetermined rate. The rate may be made small to increase a channel resistance so that an excessive current at the time of load short-circuiting can be suppressed. In place of the recesses, a step structure may be provided. Further the gate electrode (8) may cover part of the channel region (6) without providing the recesses.

13 Claims, 10 Drawing Sheets

INSULATED GATE BIPOLAR TRANSISTOR AND METHOD OF FABRICATING THE SAME

BACKGROUND OF THE INVENTION

Field of the Invention

The present invention relates to an insulated gate bipolar transistor (referred to as IGBT below) and, more particularly, to an IGBT having an increased latch-up breakdown voltage and short-circuit breakdown voltage.

Description of the Background Art

Figure 1A:
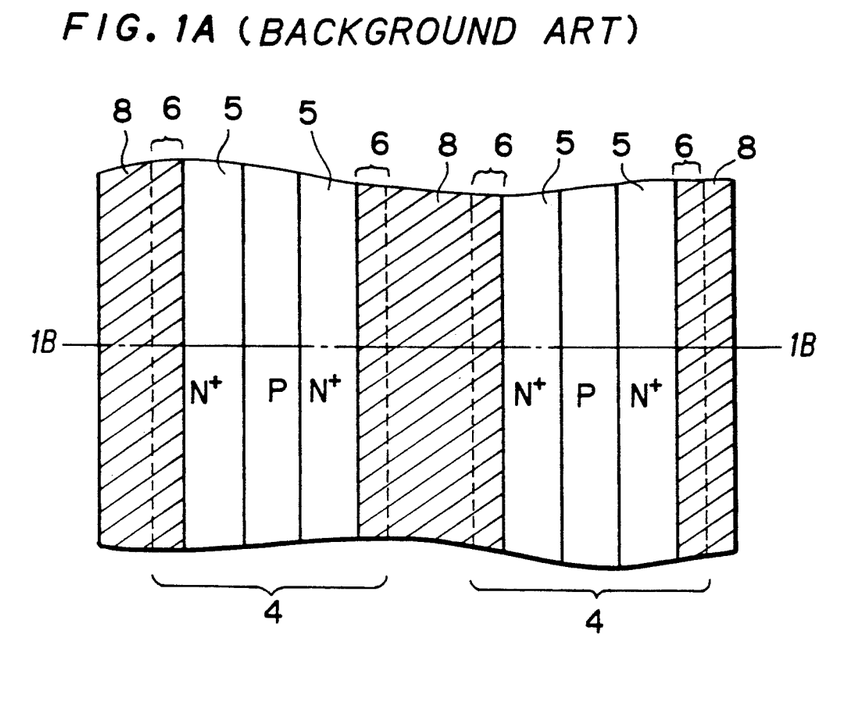
FIG. 1A is a plan view showing a conventional IGBT.
Figure 1B:
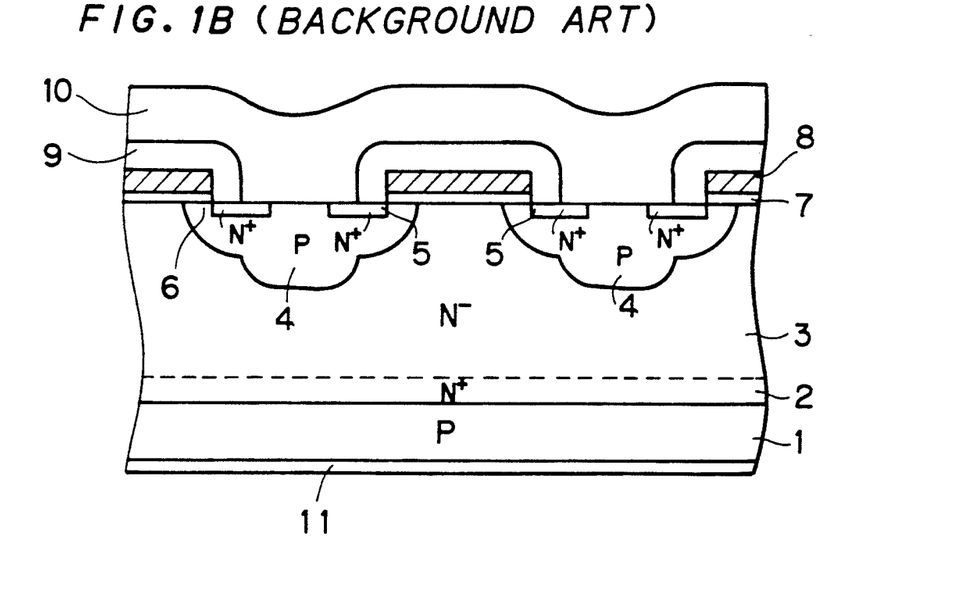
FIG. 1B is a sectional view taken along the line A-A' of FIG. 1A.

FIG. 1A is a plan view showing a structure of a conventional IGBT, and FIG. 1B is a sectional view taken along the line A-A' of FIG. 1A. As shown in FIGS. 1A and 1B, an N+ type buffer layer 2 is formed on a P type semiconductor substrate 1, and an N− type semiconductor layer 3 is formed on the N+ type buffer layer 2. A plurality of striped P type well regions 4 are selectively formed on the N− type semiconductor layer 3 by double diffusion. On each P type well region 4, two striped N+ type emitter regions 5 are selectively formed. Regions 6, which are located in the vicinity of portions of the surface of each P type well region 4 between the surfaces of the N− type semiconductor region 3, and each N+ type emitter region 5 are defined as channel regions. Gate insulation films 7, are provided on the channel regions 6, and gate electrodes 8 are formed thereon. Insulation films 9 are provided to cover the gate electrodes 8, and an emitter electrode 10 is formed thereon to electrically connect both with the P type well regions 4 and N+ type emitter regions 5. A collector electrode 11 is formed on the back surface of the P type semiconductor substrate 1. The plan view in FIG. 1A exhibits a state before the formation of the insulation films 9 and emitter electrode 10.

Figure 2:
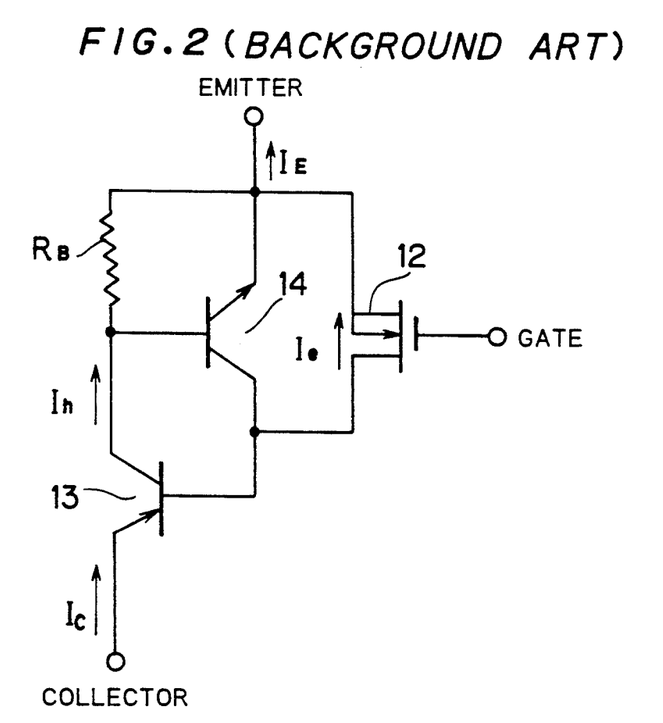
FIG. 2 is a circuit diagram showing an equivalent circuit of an IGBT cell.

FIG. 2 is a circuit diagram showing an equivalent circuit of a cell of the IGBT. An N channel MOSFET 12 is formed in the vicinity of the channel regions 6. An PNP transistor 13 is formed of the P type semiconductor substrate 1, N− type semiconductor layer 3 and P type well region 4, and an NPN transistor 14 is formed of the N− type semiconductor layer 3, P type well region 4 and N+ type emitter region 5.

Electrons flow from the N+ type emitter regions 5 to the N− type semiconductor layer 3 through inversion layers formed in the channel regions 6 by applying a plus potential to the gate electrodes 8 while applying a plus potential to the collector electrode 11 and a minus potential to the emitter electrode 10. An electron current flowing in such a manner is represented by $I_e$ in FIG. 2. Holes of minority carriers are injected into the N− type semiconductor layer 3 from the P type semiconductor substrate 1. Some of the holes disappear by recombining with the aforementioned electrons and the remainder flow in the P type well regions 4 as a hole current $I_h$. In this way, the IGBT functions basically as a bipolar transistor and, therefore, has an advantage that, as compared with a conventional power MOSFET, a lower ON state voltage and a larger current capacity can be implemented because the conductivity of the N− type semiconductor layer 3 is increased by virtue of a conductivity modulation.

On the other hand, as will be apparent from the equivalent circuit in FIG. 2, the IGBT cell has a parasitic PNPN thyristor structure formed of the PNP transistor 13 and NPN transistor 14. When both the transistors 13 and 14 are activated and the sum of current amplification factors $\alpha_1$ and $\alpha_2$ of the transistors 13 and 14 become equal to 1, the parasitic thyristor is conductive and latch-up occurs. With regard to its structure, the thickness of the N− type semiconductor layer 3 serving as a base of the PNP transistor 13 is very large as compared with a carrier diffusion length, and hence $\alpha_1$ has a relatively small value. Additionally, the NPN transistor 14 can not be easily turned on because its base and emitter are short-circuited. Hence, the latch-up does not occur in the normal operation, and the IGBT cell functions as a composite device of the n channel MOSFET 12 and the PNP transistor 13. In such a case, since the base current of the PNP transistor 13 is controlled by the n channel MOSFET 12, it becomes possible that the main current $I_C$ flowing from the collector electrode 11 is controlled by a control signal applied to the gate electrodes 8. The following relation holds $$I_C = I_E = I_e + I_h \tag{1}$$

where $I_E$ is a current flowing in the emitter electrode 10.

However, when the main current $I_C$ is increased due to any external cause such as load short-circuiting, the electron current $I_e$ and hole current $I_h$ are increased. Then, when the hole current $I_h$ exceeds a certain value, the NPN transistor 14 becomes conductive because of the voltage drop in resistance $R_B$ in the P type well regions 4, and its current amplification factor $\alpha_2$ is increased. This causes $\alpha_1 + \alpha_2 = 1$ to be satisfied, so that the parasitic thyristor becomes conductive. Thus, the IGBT is latched up. In such a state, the main current $I_C$ in the IGBT can hardly be controlled by the control signal applied to the gate electrodes 8, and therefore an excessive main current $I_C$ flows without limitation. Even if the IGBT is not latched up, the IGBT may be destroyed by a thermal breakdown since a large main current $I_C$ continues to flow. Accordingly, with regard to the conventional IGBT, it is desired to increase its latch-up breakdown voltage and short-circuit breakdown voltage.

SUMMARY OF THE INVENTION

In the first aspect of the present invention, an insulated gate bipolar transistor comprises a first conductivity type first semiconductor layer having first and second major surfaces, a second conductivity type second semiconductor layer formed on the first major surface of the first semiconductor layer, a first conductivity type first semiconductor region selectively formed on the second semiconductor layer, a second conductivity type second semiconductor region selectively formed on the first semiconductor region, the first semiconductor region having a channel region in the vicinity of a surface of the first semiconductor region between surfaces of the second semiconductor layer and the second semiconductor region, an insulation film formed on the channel region, a gate electrode formed on the insulation film in a manner that an end portion of the gate electrode has recesses so that the gate electrode covers part of the channel region at a predetermined rate, a first electrode formed on the second semiconductor region, and a second electrode formed on the second major.

In accordance with the present invention, since the end portion of a gate electrode has recesses so as to cover part of a channel region at a predetermined rate, a channel resistance is determined depending upon the predetermined rate. The rate may be made small to increase the channel resistance so that the excessive flow of current at the time of load short-circuiting can be suppressed.

When a gate electrode has a step structure on a channel region or when a gate electrode is provided only on a part of a channel region, a channel resistance is also increased, so that the excessive flow of current in load short-circuiting can be suppressed similar to the above case.

Accordingly, it is an object of the present invention to provide an IGBT with a simple structure which has a high latch-up breakdown voltage and a high short-circuit breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 3A:
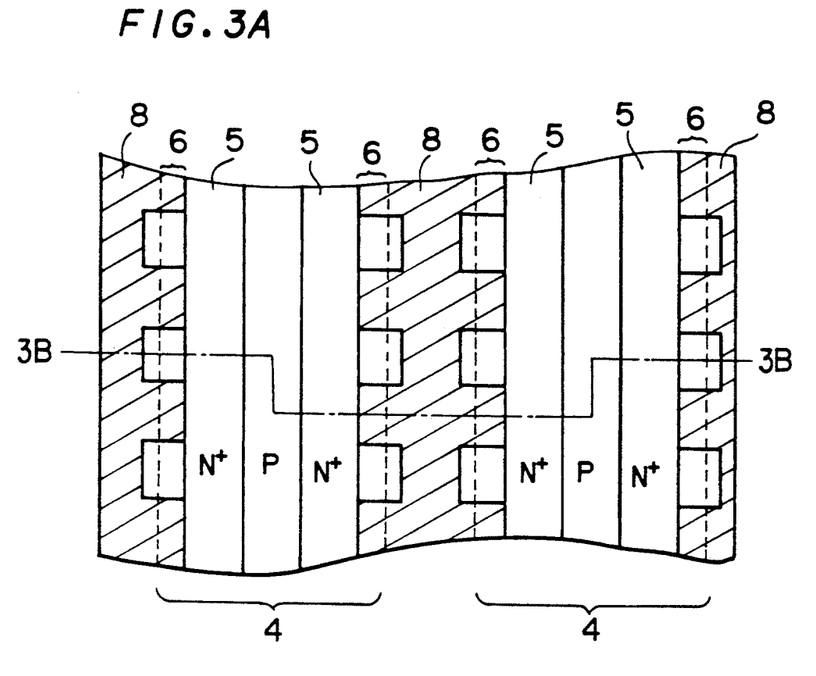
FIG. 3A is a plan view showing an embodiment of an IGBT according to the present invention.
Figure 3B:
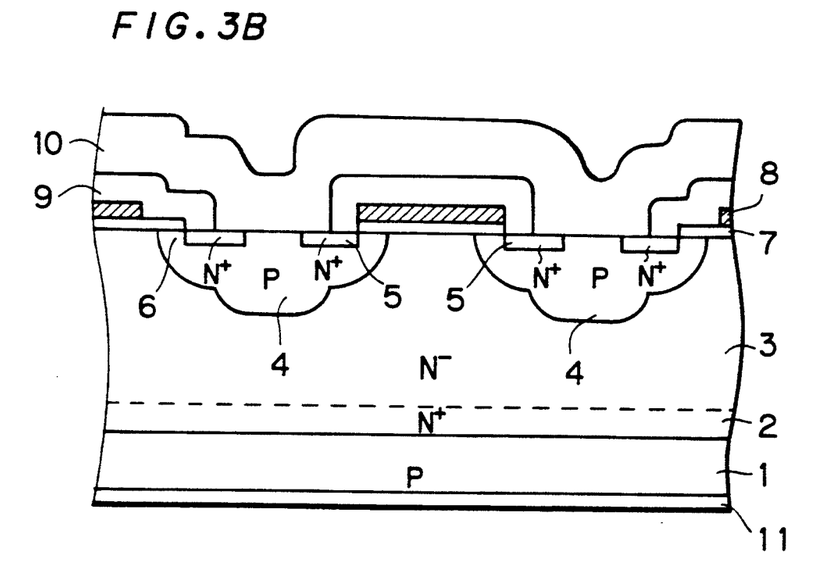
FIG. 3B is a sectional view taken along the line B—B' of FIG. 3A.

FIG. 3A is a plan view showing the structure of an IGBT according to an embodiment of the present invention, and FIG. 3B is a sectional view taken along the line B—B' of FIG. 3A. As shown in FIGS. 3A and 3B, an N+ type buffer layer 2 is formed on a P type semiconductor substrate 1, and an N− type semiconductor layer 3 is formed thereon. The N+ type buffer layer 2 serves for controlling a hole injection efficiency from the P type semiconductor substrate 1 to the N− type semiconductor layer 3. A plurality of striped P type well regions 4 are selectively formed on the N− type semiconductor layer 3 by double diffusion. On each P type well region 4, two striped N+ type emitter regions 5 are selectively formed. Regions 6, which are located in the vicinity of portions of the surface of each P type well region 4 between the surfaces of the N− type semiconductor layer 3 and each N+ type emitter region 5, are defined as channel regions. Gate insulation films 7 are provided on the channel regions 6, and gate electrodes 8 are formed thereon.

Unlike a conventional IGBT, end portions of the gate electrodes 8 are formed not to be straight but to have recesses so that each gate electrode 8 covers part of each channel region 6 at a predetermined rate. Insulation films 9 are provided over the gate electrodes 8, and an emitter electrode 10 is formed thereon to electrically connect both with the P type well regions 4 and N+ type emitter regions 5. A collector electrode 11 is formed on the back surface of the P type semiconductor substrate 1. The plan view in FIG. 3A illustrates a state before the formation of the insulation films 9 and emitter electrode 10.

Figure 4A:
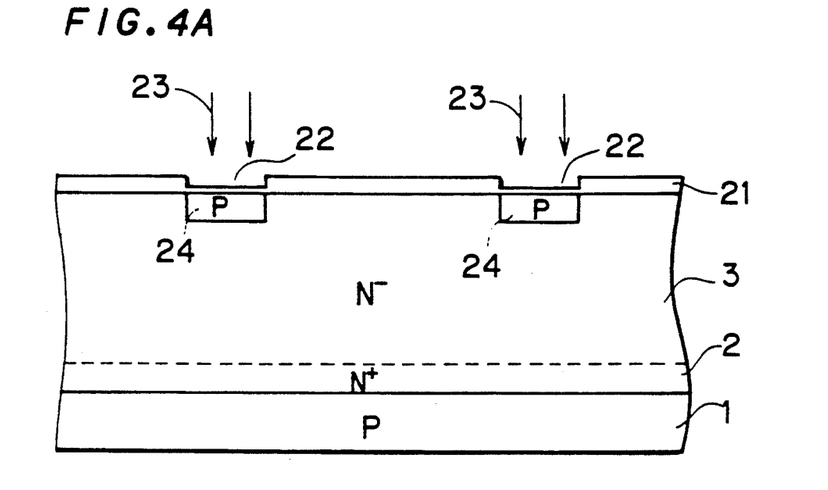
FIGS. 4A to 4F are sectional views illustrating an example of a method of manufacturing the IGBT according to the present invention.

A manufacturing method of the IGBT will now be described with reference to FIGS. 4A to 4F. Referring to FIG. 4A, the N+ type buffer layer 2 and then the N− type semiconductor layer 3 are formed on the upper major surface of the P type semiconductor substrate 1 by means of epitaxial growing. This substrate thus obtained is subjected to chemical treatment using chemicals including hydrochloric acid and nitric acid to remove contaminations such as heavy metal. Further, for pretreatment, rinsing and removal of an oxide film by chemical treatment with diluted hydrofluoric acid take place. Then the substrate is subjected to thermal oxidation in a furnace, so that an $SiO_2$ film 21 having a thickness of approximately 7000 to 10,000 Å is formed on the N− type semiconductor layer 3. The $SiO_2$ film 21 is selectively removed by etching with diluted hydrofluoric acid to make windows 22. P type impurities 23 such as boron are selectively injected through the windows 22 by means of ion implantation and are then diffused to form P type diffusion regions 24.

Figure 4B:
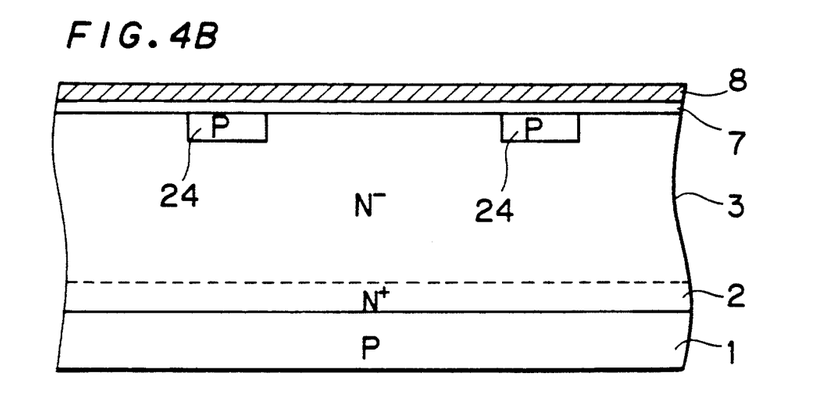

Referring to FIG. 4B, the $SiO_2$ film 21 is removed and instead the gate insulation film 7 of $SiO_2$ is formed by thermal oxidation. The thickness of the gate insulation film 7 must be controlled with high accuracy because it is an important factor for determining a threashold voltage. Usually the thickness ranges approximately from 1000 to 1500 Å. The gate electrode 8 of polysilicon having a thickness of 3000 to 5000 Å is formed on the gate insulation film 7 by means of CVD.

Figure 4C:
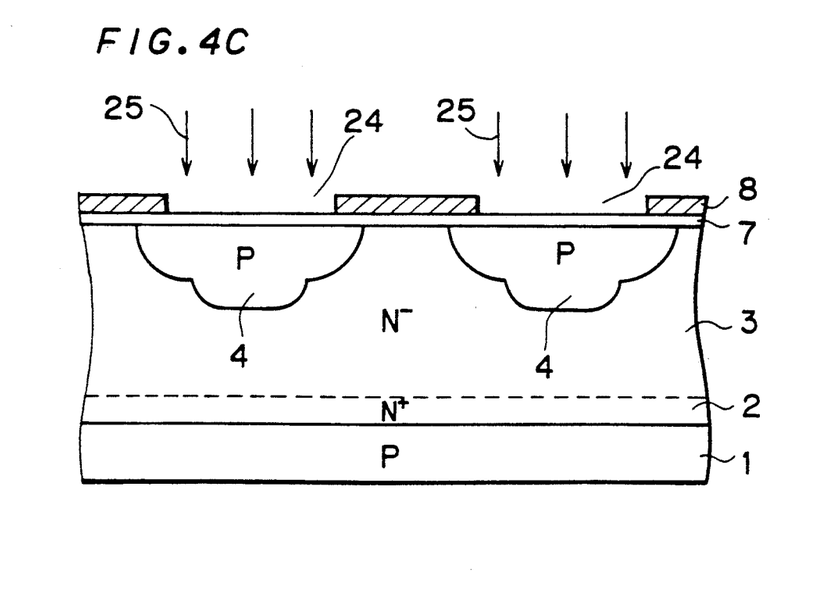

Then, as shown in FIG. 4C, the gate electrode 8 is selectively removed by selective plasma etching to make windows 24 therein. P type impurities 25 such as boron are selectively injected through the windows 24 by ion implantation and then diffused to form the P type well regions 4.

Figure 4D:
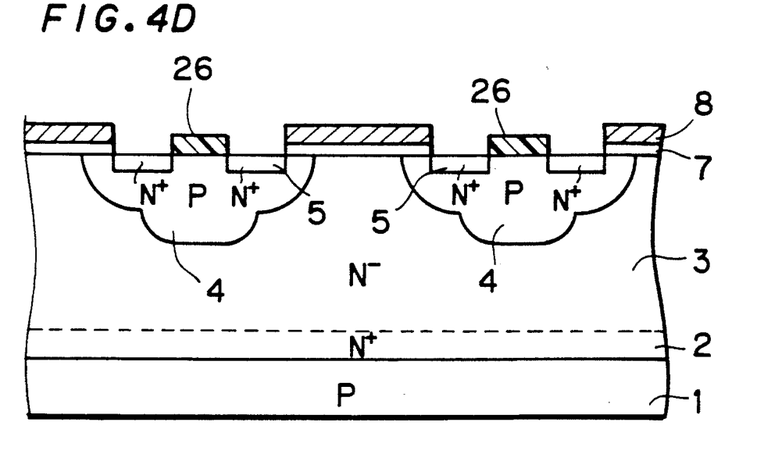

Referring to FIG. 4D, the gate insulation film 7 is selectively removed through the windows 24 by selective etching with diluted hydrofluoric acid, and instead resist masks 26 are partially formed. Further, N type impurities such as phosphorus are deposited and diffused to form the N+ type source regions 5. At the same time, N+ diffusion is performed in the gate electrodes 8 to reduce the gate resistance.

Figure 4E:
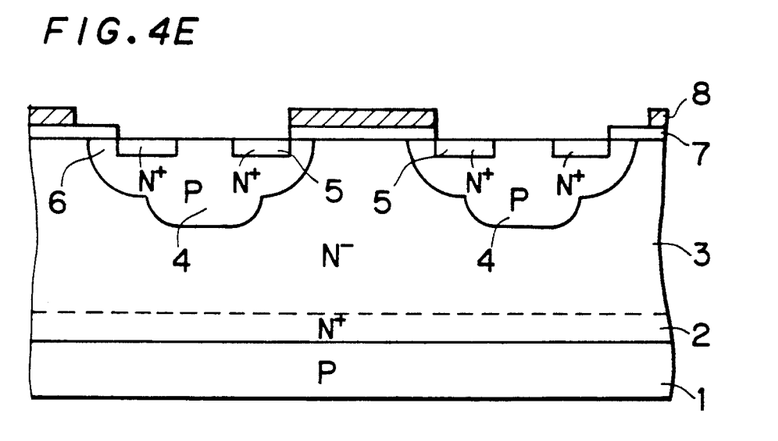

Then, as shown in FIG. 4E, the resist masks 26 are removed. The edges of the gate electrodes 8 are selectively removed by selective plasma etching to form recesses as shown well in the plan view of FIG. 3A. In this way, the gate electrodes 8 cover only part of the channel regions 6 with a predetermined rate.

Figure 4F:
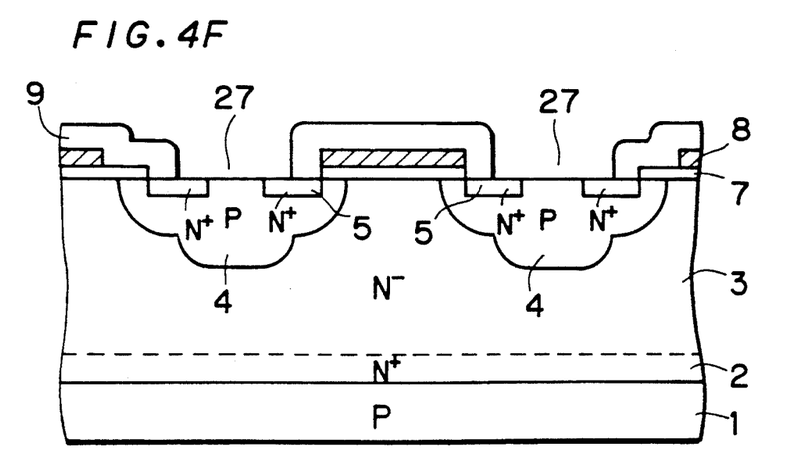

An SiO₂ film is formed over the whole surface by means of CVD and then is selectively removed by selective etching with diluted hydrofluoric acid to make contact holes 27. As a result, the insulation films 9 are formed as shown in FIG. 4F. The insulation films 9 are called passivation film, which serve for insulation as well as for preventing contaminations from entering. The insulation films 9 are 1.5 μm in thickness. The emitter electrode 10 of metal such as Al-Si is formed on the insulation films 9 to electrically connect both with the P type well regions 4 and the N+ type emitter regions 5 through the contact holes 27. Similarly, the collector electrode 11 of metal is formed on the lower major surface (back surface) of the P type semiconductor substrate 1. Thus, the IGBT shown in FIG. 3B is implemented.

In operation, when a plus potential is applied to the gate electrodes 8 while applying a plus potential to the collector electrode 11 and a minus potential to the emitter electrode 10, inversion layers are formed in the channel regions 6 and the IGBT is turned on, so that a main current flows from the collector electrode 11 to the emitter electrode 10. The inversion layers in the channel regions 6 disappear when the potential in the gate electrode 8 is at zero or minus, so that the IGBT is turned off.

Channel resistance $R_{ch}$ is given by the following equation:

$$R_{ch} = L/C_{ox} \cdot \mu \cdot (V_G - V_{th}) \cdot W \quad (2)$$

where L is an effective channel length, W is an effective channel width, $C_{ox}$ is a capacity of the gate insulation film 7 per unit area, $\mu$ is a moving rate of electrons in a channel, $V_G$ is a gate applied voltage and $V_{th}$ is a threashold voltage.

In this embodiment, the end portions of the gate electrodes 8 have recesses so ads to cover part of the channel regions 6 at a predetermined rate. When the predetermined rate is 1/N, the effective channel width W decreases to W/N. This causes the channel resistance $R_{ch}$ to increase to $NR_{ch}$. As a result, the flow of the collector current is decreased at the time of load short-circuiting and the like, so that the latch-up breakdown voltage and short-circuit breakdown voltage are enhanced.

In other words, since there are regions not covered with gate electrodes 8 (i.e., bypass regions) on the channel regions 6 at a prescribed rate, the amount of electrons injected from the N+ type emitter regions 5 to the N− type semiconductor layer 3 is reduced due to the reduction of the inversion layer when the IGBT is turned on. Accordingly, the amount of holes injected from the P type semiconductor substrate 1 to the N− type semiconductor layer 3 is also decreased. In this way, the current flowing between the collector electrode 11 and the emitter electrode 10 is decreased, whereby excess current does not easily flow even in load short-circuiting.

The current amplification factor $\alpha_1$ of the PNP transistor formed of the P type semiconductor substrate 1, the N− type semiconductor layer 3 and type P type well regions 4 has an innegligible effect on the latch-up and short-circuit breakdown voltages. This $\alpha_1$ can not be easily controlled because it highly depends upon the balance between the amount of electrons injected from the N+ type emitter regions 5 and the amount of holes injected from the P type semiconductor substrate 1. Hence, it has conventionally been difficult to control only the latch-up and short-circuit breakdown voltages independently. According to the present invention, the bypass ratio on the gate electrodes 8 is varied, so that the latch-up and short-circuit breakdown voltages alone can be independently controlled.

Figure 5:
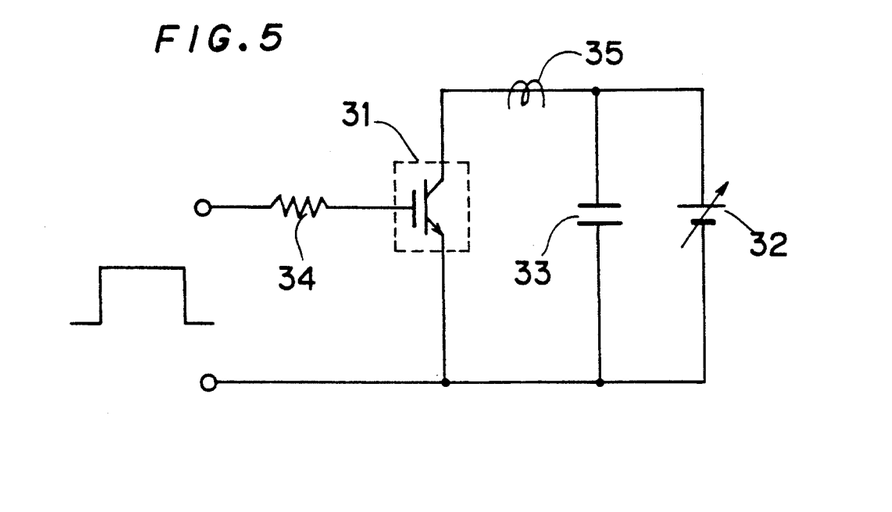
FIG. 5 is a circuit diagram showing a short-circuit test circuit for the IGBT.
Figure 6:
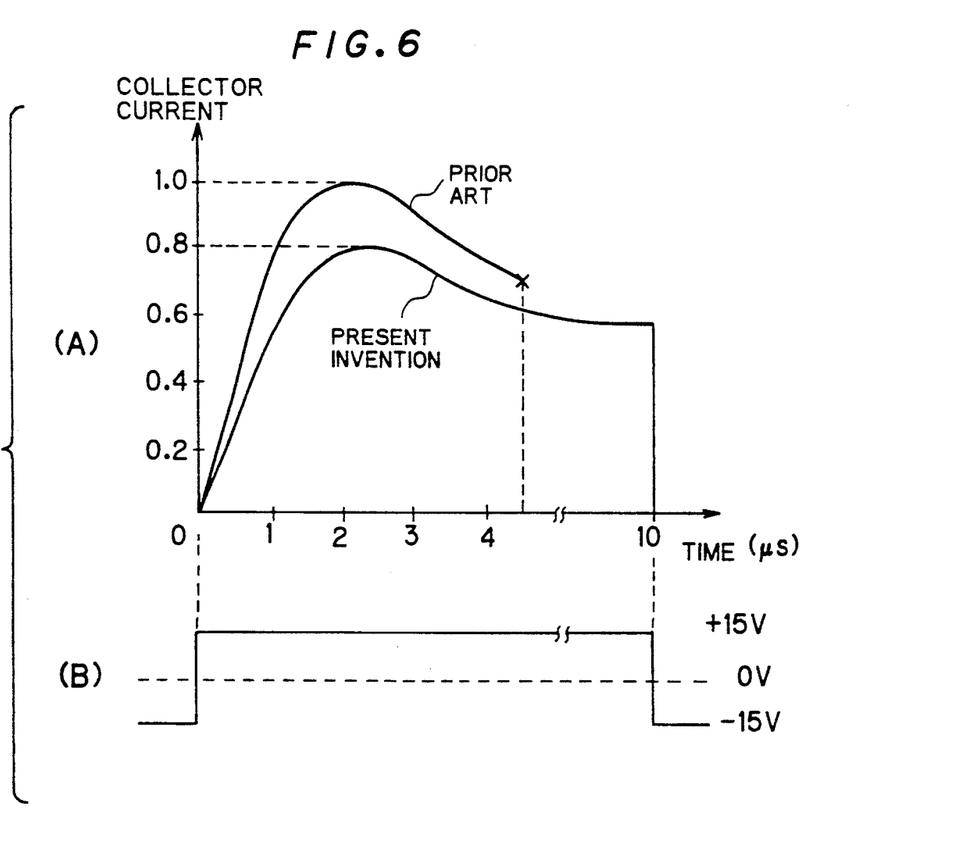
FIG. 6 is a diagram illustrating an example of the result of the short-circuit test.

FIG. 5 is a diagram showing a short-circuit test circuit for an IGBT. The voltage of a capacitor 33 charged by a power source 32 is directly applied across the collector and the emitter of an IGBT 31 to be tested. A pulse of 10 μs width shown in FIG. 6 (B) is applied to the gate of the IGBT 31 through a resistor 34, and then the collector current flowing in the IGBT 31 is measured by a current sensor 35. FIG. 6 (A) is a graph for illustrating a relationship of measuring results in the IGBT of the present invention and the prior art IGBT having the same structure except for the differences in gate electrode 8. The bypass ratio (the rate of the recesses) of the gate electrodes 8 is 20% in the IGBT of the present invention. The collector current is normalized by settling the peak value of the conventional IGBT (approximately 300 A/cm²) at 1. The conventional IGBT was broken down at about 4.5 μs due to a thermal breakdown caused by the excess flow of current although not latched up. Conversely, the IGBT of the present invention was not broken down after 10 μs because the collector current was effectively controlled. The latch-up occurs near the peak of the collector current. According to the present invention, however, the peak value is lowered and hence the latch-up can be effectively avoided, as will be recognized in FIG. 6. In the conventional IGBT, a collector current nine times as large as the rated current flows at the time of load short-circuiting. In accordance with the present invention, however, if the bypass ratio of gate electrodes 8 is made large, the collector current can be reduced to an amount 2 to 4 times as large as the rated current.

Figure 7A:
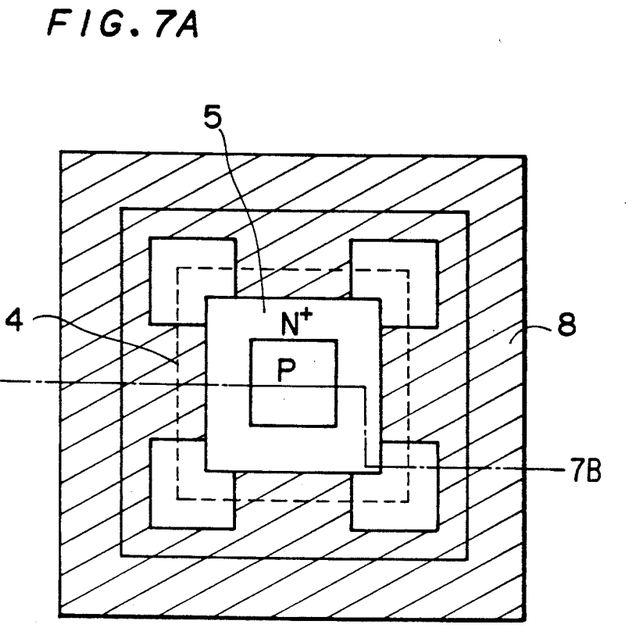
FIG. 7A is a plan view showing an application of the present invention to a square IGBT cell.
Figure 7B:
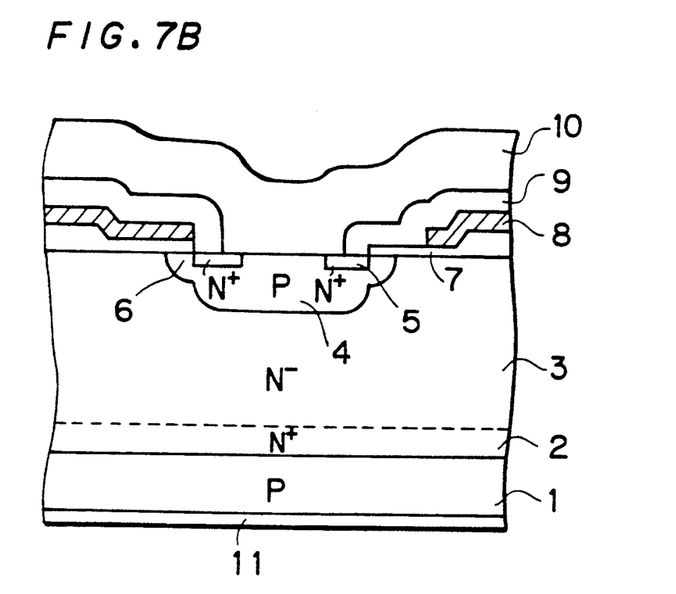
FIG. 7B is a sectional view taken along the line C—C' of FIG. 7A.
Figure 8A:
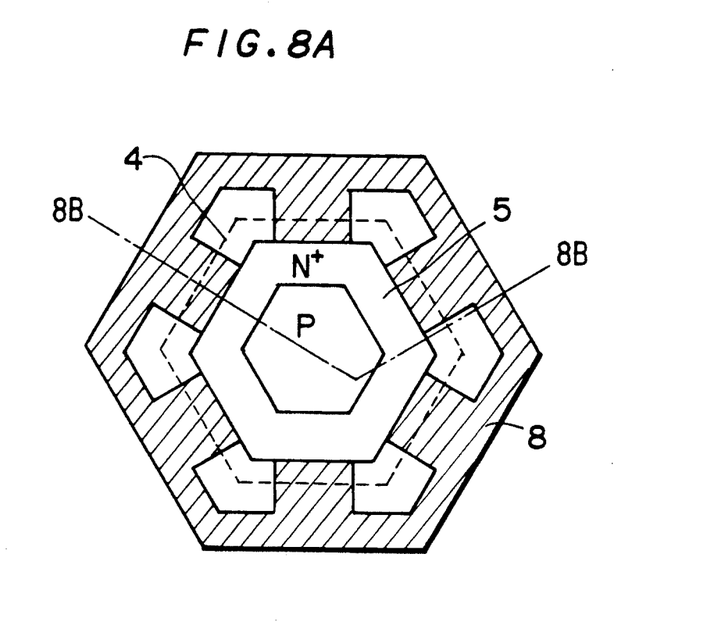
FIG. 8A is a plan view showing an application of the present invention to a hexagonal IGBT cell.
Figure 8B:
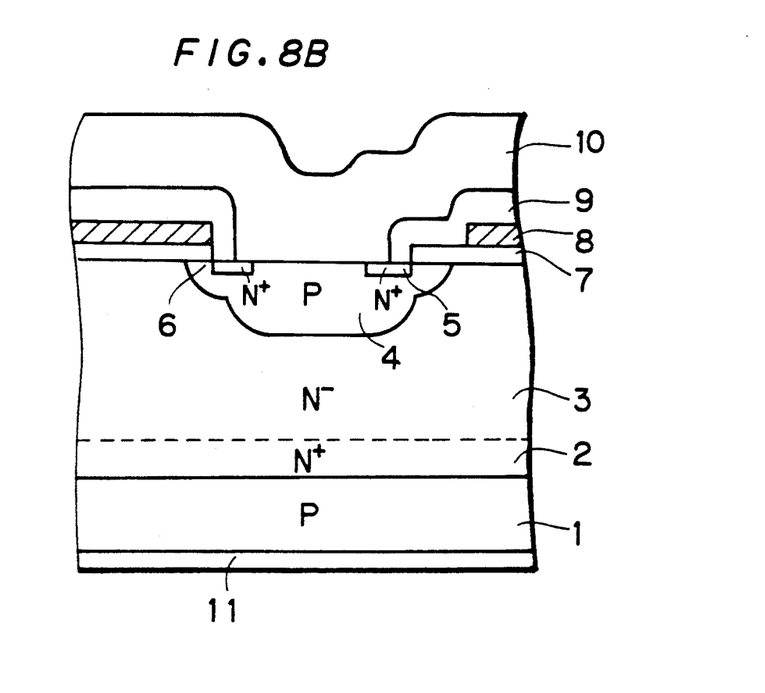
FIG. 8B is a sectional view taken along the line D—D' of FIG. 8A.

The recess structure (bypass structure) of the end portions of the gate electrodes 8 according to the present invention can be applied to any other IGBT cell such as a square IGBT cell or hexagonal IGBT cell as well as the above stated striped IGBT cell. FIG. 7A is a plan view showing an application of the recess structure of the gate electrodes 8 to a square IGBT cell, and FIG. 7B is a sectional view taken along the line C—C' of FIG. 7A. FIG. 8A is a plan view showing an application of the recess structure of the gate electrodes 8 to a hexagonal IGBT cell, and FIG. 8B is a sectional view taken along the line D—D' of FIG. 8A. The same effects as in the above embodiment can be obtained in these exemplary applications.

Figure 9A:
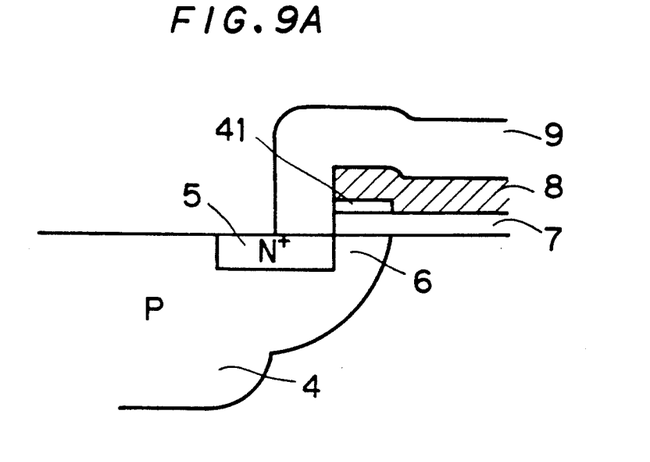
FIGS. 9A to 9C are partial sectional views showing another embodiment of the present invention.
Figure 9B:
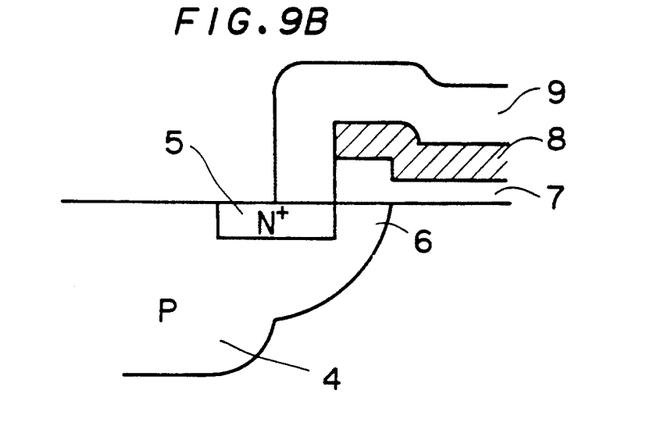
Figure 9C:
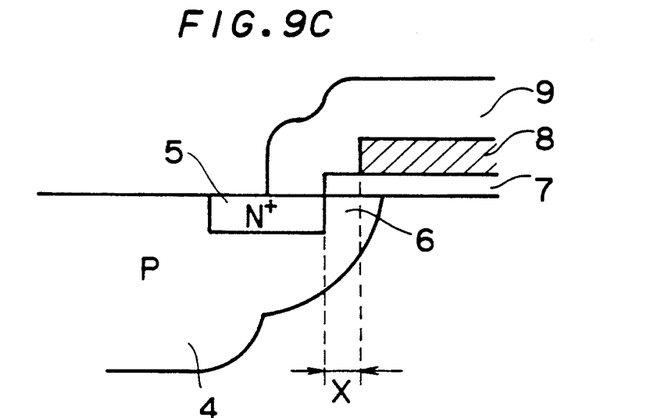

FIGS. 9A to 9C are partial sectional views showing another embodiment of the structure of a gate electrode 8 employed for increasing a channel resistance $R_{ch}$. In an embodiment of FIG. 9A, a gate electrode 8 has a step structure on a channel region 6, and a gap 41 is defined between a gate insulation film 7 and the gate electrode 8 corresponding to the step structure. In an embodiment of FIG. 9B, a gate electrode 8 has a step structure on a channel region 6, and the thickness of a gate insulation film 7 on the channel region 6 is adapted to be thick correspondingly to the step structure of the gate electrode 8. In an embodiment of FIG. 9C, a gate electrode 8 has no recesses and is provided only on a part of a channel region 6. In this case, the channel resistance $R_{ch}$ is varied in accordance with a distance X. The gate electrode 8 may have any of the above stated structures in the overall end portions or may have only in a part thereof. Also, these structures can be applied to any type of IGBT cell such as a striped IGBT cell, square IGBT cell or hexagonal IGBT cell.

Figure 10:
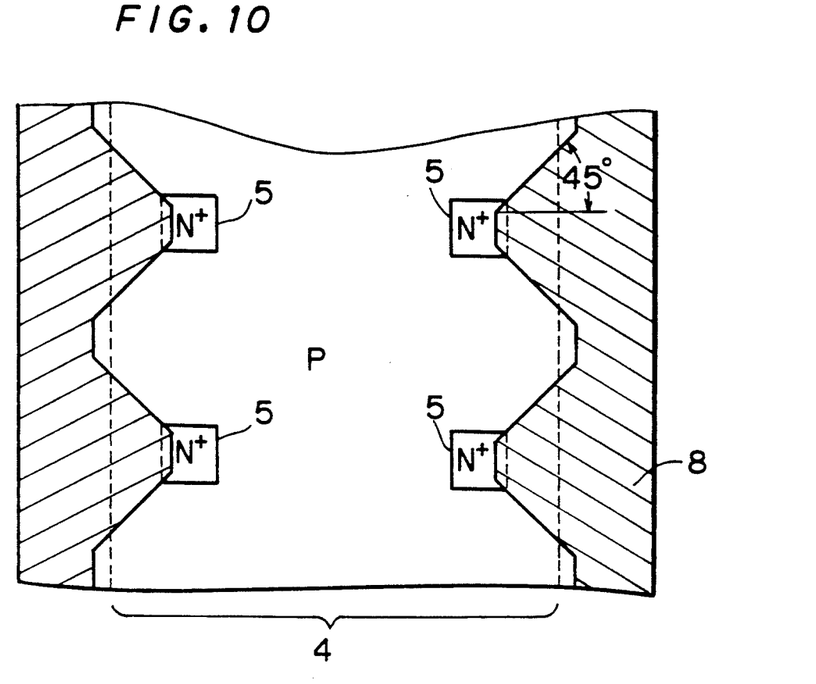
FIGS. 10 and 11 are plan views showing an application of the present invention to an IGBT having an emitter bypass structure.
Figure 11:
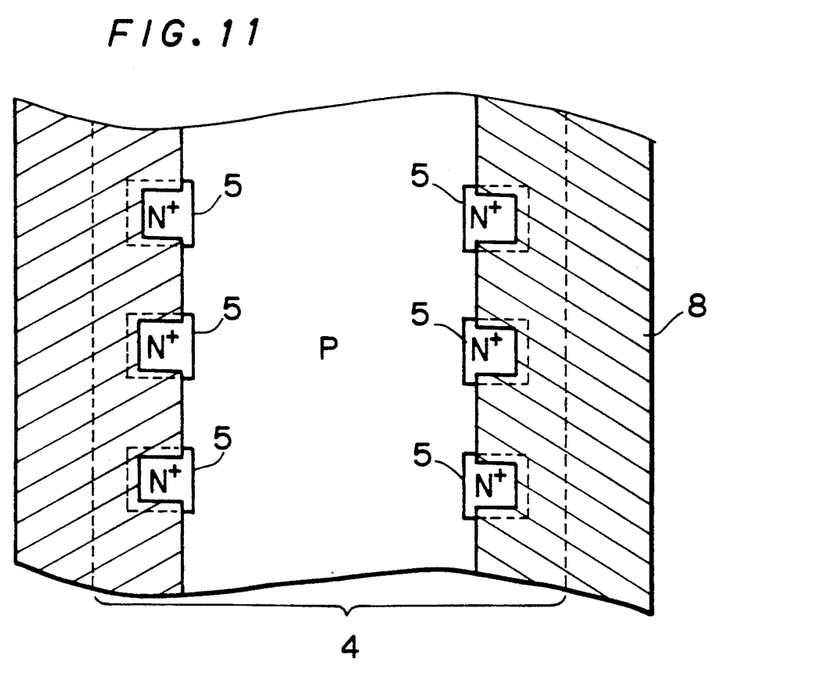

FIGS. 10 and 11 are plan views showing an embodiment in which the present invention is applied to an IGBT having an emitter by-pass structure. In the emitter by-pass structure, N+ type emitter regions 5 are partially eliminated and intermittently disposed, as can be seen. This causes the NPN transistor 14 of FIG. 2 not to easily operate, so that the latch-up breakdown voltage is enhanced. However, because of the partial elimination of the N+ type emitter regions 5, the current capacity is reduced. In the embodiment of FIG. 10, recesses at the end portions of gate electrodes 8 are tapered with an inclination at 45°. In the embodiment of FIG. 11, gate electrodes 8 have recesses at the end portions thereof, which enclose N+ type emitter regions 5 in overlapping with three sides of the N+ type emitter regions 5. These structures permit the inversion layer contiguous to the N+ type emitter regions 5 to extend and, therefore, the current to flow easily. In these embodiments a channel resistance $R_{ch}$ is not increased but decreased due to the recess structure of the end portions of the gate electrodes 8, unlike the above embodiment. However, there is no inconvenience because a latch-up breakdown voltage is assured by means of the emitter bypass structure. The inclination at 45° in the embodiment of FIG. 10 is devised allowing for the spread of the current flowing from the N+ type emitter regions 5. Thus, an IGBT can be easily designated suitably for desired characteristics as well as usage of the IGBT by appropriately combining the gate bypass structure with the emitter bypass structure.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An insulated gate bipolar transistor comprising:
   a first conductivity type first semiconductor layer having first and second major surfaces;
   a second conductivity type second semiconductor layer formed on said first major surface of said first semiconductor layer;
   a first conductivity type first semiconductor region selectively formed in said second semiconductor layer;
   a second conductivity type second semiconductor region selectively formed in said first semiconductor region;
   said first semiconductor region having a channel region in the vicinity of a surface of said first semiconductor region between surfaces of said second semiconductor layer and said second semiconductor region;
   an insulation film formed on said channel region;
   a gate electrode formed on said insulation film in a manner that an end portion of said gate electrode has recesses so that said gate electrode covers part of said channel region at a predetermined rate, said recesses regularly provided at a constant distance along said channel region;
   a first electrode formed on said second semiconductor region; and
   a second electrode formed on said second major surface of said first semiconductor layer.

2. An insulated gate bipolar transistor in accordance with claim 1, wherein
   said first and second semiconductor regions have stripe configurations.

3. An insulated gate bipolar transistor in accordance with claim 1, wherein
   said first and second semiconductor regions have polygonal configurations.

4. An insulated gate bipolar transistor in accordance with claim 3, wherein
   said polygonal configurations include squares.

5. An insulated gate bipolar transistor in accordance with claim 3, wherein
   said polygonal configurations include hexagons.

6. An insulated gate bipolar transistor in accordance with claim 1, wherein
   said second semiconductor region comprises a plurality of semiconductor regions formed in a bypass structure wherein said plurality of semiconductor regions are intermittently disposed.

7. An insulated gate bipolar transistor in accordance with claim 6, wherein
   said recesses of said end portion of said gate electrode are formed correspondingly to between said plurality of semiconductor regions.

8. An insulated gate bipolar transistor in accordance with claim 7, wherein
   said recesses are tapered at a predetermined angle.

9. An insulated gate bipolar transistor in accordance with claim 6, wherein
   said recesses of said end portion of said gate electrode are formed correspondingly to said plurality of semiconductor regions.

10. An insulated gate bipolar transistor in accordance with claim 9, wherein
    said recesses enclose part of sides of said plurality of semiconductor regions.

11. An insulated gate bipolar transistor comprising:
    a first conductivity type first semiconductor layer having first and second major surfaces;
    a second conductivity type second semiconductor layer formed on said first major surface of said first semiconductor layer;
    a first conductivity type first semiconductor region selectively formed in said second semiconductor layer;
    a second conductivity type second semiconductor region selectively formed in said first semiconductor region, said second semiconductor region comprising a plurality of semiconductor regions formed in a bypass structure wherein said plurality of semiconductor regions are intermittently disposed;
    said first semiconductor region having a channel region in the vicinity of a surface of said first semiconductor region between surfaces of said second semiconductor layer and said second semiconductor region;
    an insulation film formed on said channel region;
    a gate electrode formed on said insulation film in a manner that an end portion of said gate electrode has recesses so that said gate electrode covers part of said channel region at a predetermined rate, wherein said recesses are formed correspondingly between said plurality of semiconductor regions and are tapered at a 45° angle;

a first electrode formed on said second semiconductor region; and a second electrode formed on said second major surface of said first semiconductor layer.

12. An insulated gate bipolar transistor comprising:
a first conductivity type first semiconductor layer having first and second major surfaces;
a second conductivity type second semiconductor layer formed on said first major surface of said first semiconductor layer;
at least one first semiconductor type first semiconductor region selectively formed in said second semiconductor layer;
a second conductivity type second semiconductor region selectively formed in each of said first semiconductor regions;
each said first semiconductor region having two channel regions in the vicinity of a surface of said first semiconductor region, each channel region being located between surfaces of said second semiconductor layer and each of said second semiconductor regions;
an insulation film formed on said channel region;
a gate electrode formed on said insulation film in a manner that an end portion of said gate electrode has recesses so that said gate electrode covers a predetermined portion of said channel region, wherein said gate electrode can be provided on two channel regions formed on opposite first semiconductor regions;
a first electrode formed on said second semiconductor region; and
a second electrode formed on said second major surface of said first semiconductor layer.

13. The insulated gate bipolar transistor according to claim 1 wherein said recesses are regularly provided at a constant distance along said channel region.

* * * * *